United States Patent
Bedell et al.

(10) Patent No.: US 9,040,432 B2
(45) Date of Patent: May 26, 2015

(54) METHOD FOR FACILITATING CRACK INITIATION DURING CONTROLLED SUBSTRATE SPALLING

(71) Applicant: International Business Machines Corporation, Armonk, NY (US)

(72) Inventors: Stephen W. Bedell, Wappingers Falls, NY (US); Keith E. Fogel, Hopewell Junction, NY (US); Bahman Hekmatshoartabari, White Plains, NY (US); Paul A. Lauro, Brewster, NY (US); Devendra K. Sadana, Pleasantville, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 143 days.

(21) Appl. No.: 13/774,643

(22) Filed: Feb. 22, 2013

(65) Prior Publication Data

US 2014/0242807 A1 Aug. 28, 2014

(51) Int. Cl.
*H01L 21/02* (2006.01)

(52) U.S. Cl.
CPC ................................ *H01L 21/02318* (2013.01)

(58) Field of Classification Search
None
See application file for complete search history.

(56) References Cited

U.S. PATENT DOCUMENTS

| | | | |
|---|---|---|---|
| 4,582,559 A * | 4/1986 | Tanielian et al. | 204/192.25 |
| 4,592,308 A | 6/1986 | Shih et al. | |
| 5,292,399 A | 3/1994 | Lee et al. | |
| 5,810,931 A | 9/1998 | Stevens et al. | |
| 6,051,122 A | 4/2000 | Flanigan | |
| 6,380,094 B1 | 4/2002 | Seidel et al. | |
| 6,433,463 B1 | 8/2002 | Lal et al. | |
| 6,452,091 B1 * | 9/2002 | Nakagawa et al. | 136/261 |
| 6,797,625 B2 | 9/2004 | Kim et al. | |
| 2007/0249140 A1 * | 10/2007 | Dross et al. | 438/458 |
| 2010/0310775 A1 | 12/2010 | Bedell et al. | |

(Continued)

FOREIGN PATENT DOCUMENTS

| | | |
|---|---|---|
| DE | 10024858 A1 | 11/2001 |
| JP | 2002134413 | 5/2002 |

(Continued)

OTHER PUBLICATIONS

Bedell, S., et al., "Kerf-Less Removal of Si, Ge, and III—V Layers by Controlled Spalling to Enable Low-Cost PV Technologies", IEEE Journal of Photovoltaics, Apr. 2012, vol. 2, No. 2, p. 141.

(Continued)

*Primary Examiner* — Charles Garber
*Assistant Examiner* — Stanetta Isaac
(74) *Attorney, Agent, or Firm* — Scully, Scott, Murphy & Presser, P.C.; Louis J. Percello, Esq.

(57) ABSTRACT

A method is provided in which a substrate including various materials of different fracture toughness ($K_{Ic}$) can be spalled in a controlled manner. In particular, a surface step region is formed within a surface portion of the substrate prior to formation of a stressor layer. The presence of the surface step region within the surface portion of the substrate controls the depth and ease at which crack initiation occurs within the substrate.

24 Claims, 3 Drawing Sheets

(56) References Cited

U.S. PATENT DOCUMENTS

| | | |
|---|---|---|
| 2010/0311250 A1 | 12/2010 | Bedell et al. |
| 2010/0323472 A1* | 12/2010 | Dross et al. .................... 438/96 |
| 2011/0048516 A1 | 3/2011 | Bedell et al. |
| 2011/0048517 A1 | 3/2011 | Bedell et al. |
| 2012/0217622 A1 | 8/2012 | Bedell et al. |
| 2012/0322227 A1* | 12/2012 | Bedell et al. .................. 438/458 |
| 2012/0322244 A1* | 12/2012 | Bedell et al. .................. 438/478 |
| 2013/0005116 A1 | 1/2013 | Bedell et al. |
| 2013/0306971 A1* | 11/2013 | Bedell et al. .................... 257/59 |
| 2013/0316542 A1* | 11/2013 | Bedell et al. .................. 438/759 |

FOREIGN PATENT DOCUMENTS

| | | |
|---|---|---|
| JP | 2003297812 | 10/2003 |
| WO | WO0191178 A1 | 11/2001 |

OTHER PUBLICATIONS

Thorton, J. A., et al., "Internal stresses in titanium, nickel, molybdenum, and tantalum films deposited by cylindrical magnetron sputtering", J. Vac. Sci. Technol., Jan./Feb. 1977, vol. 14, No. 1.

* cited by examiner

US 9,040,432 B2

METHOD FOR FACILITATING CRACK INITIATION DURING CONTROLLED SUBSTRATE SPALLING

BACKGROUND

The present disclosure relates to substrate fabrication and more particularly to a method of removing a material layer from a substrate utilizing a controlled spalling process in which a surface step region is created in the substrate prior to formation of a stressor layer.

Devices such as, for example, photovoltaic and electro-optical, that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Patent Application Publication No. 2010/0311250 A1 to Bedell et al., of a novel layer transfer method referred to as 'controlled spalling technology' has permitted the fabrication of low-cost, thin-film, high quality substrates by removing a surface layer from a substrate. The thin-film substrate layers that can be removed by this controlled spalling technology can be used to 1) increase the cost per Watt value of conventional photovoltaic technology or 2) permit fabrication of novel, high-efficiency photovoltaic, electronic and opto-electronic materials that are flexible and can be used to produce new products.

Despite being able create thin-film substrates, a method is needed which can control the depth and ease in which crack initiation occurs within a substrate during a controlled spalling process.

SUMMARY

A method is provided in which a substrate including various materials of different fracture toughness ($K_{Ic}$) can be spalled in a controlled manner. In particular, a surface step region is formed within a surface portion of the substrate prior to formation of a stressor layer. The presence of the surface step region within the surface portion of the substrate controls the depth and ease at which crack initiation occurs within the substrate. The term "surface step region" is used throughout the present disclosure to denote a region located at each vertical edge and on a front side of the substrate in which a first exposed horizontal surface of the substrate is vertically offset from a second exposed horizontal surface of the substrate.

In one embodiment of the present disclosure, the surface step region can be provided within the substrate by forming a substrate that includes, from bottom to top, a base portion and a non-continuous surface portion, wherein the non-continuous surface portion is absent edge regions of the substrate. In another embodiment, the surface step region can be provided within the substrate by forming a substrate that includes, from bottom to top, a base portion and a continuous surface portion, wherein the continuous surface portion comprises a recessed surface and a non-recessed surface.

In an aspect of the present disclosure, a method of removing a material layer from a substrate containing materials of different fracture toughness is provided. In particular, the method includes providing a substrate comprising, from bottom to top, a base portion comprising at least one first material and having a first fracture toughness and a surface portion comprising at least one second material and having a second fracture toughness, wherein the second fracture toughness differs from the first fracture toughness and wherein a surface step region is located at each vertical edge and on a front side of the substrate. Next, a stressor layer is formed atop the front side of the substrate. A material layer is then removed from the substrate by spalling, wherein crack propagation occurs only in one of the first material or the second material.

DETAILED DESCRIPTION

The present disclosure will now be described in greater detail by referring to the following discussion and drawings that accompany the present application. It is noted that the drawings of the present application are provided for illustrative purposes and, as such, they are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Controlled spalling technology, as described in U.S. Patent Application Publication No. 2010/0311250 A1 to Bedell et al., has been shown to be a useful and versatile layer transfer technique. An important requirement to enable spalling mode fracture is the existence of a microcrack that can be propagated below a substrate. The formation of stress discontinuity at the periphery of the substrate has been described, for example, in U.S. Patent Application Publication No. 2013/0005116 A1 to Bedell et al., as a means for forming a controlled crack initiating region within the substrate.

It has now been determined that when performing controlled spalling on substrates that contain material layers of different fracture toughness ($K_{Ic}$), there is an additional advantage afforded by creating a surface step region within the substrate prior to formation of the stressor layer. The creation of the surface step region within the substrate prior to spalling has been found to control the depth and ease at which crack initiation begins in substrates containing material layers with different fracture toughness values.

Reference is now made to FIGS. 1-6B which illustrate the basic processing steps of the method of the present disclosure for facilitating crack formation during a controlled spalling process.

Figure 1A:
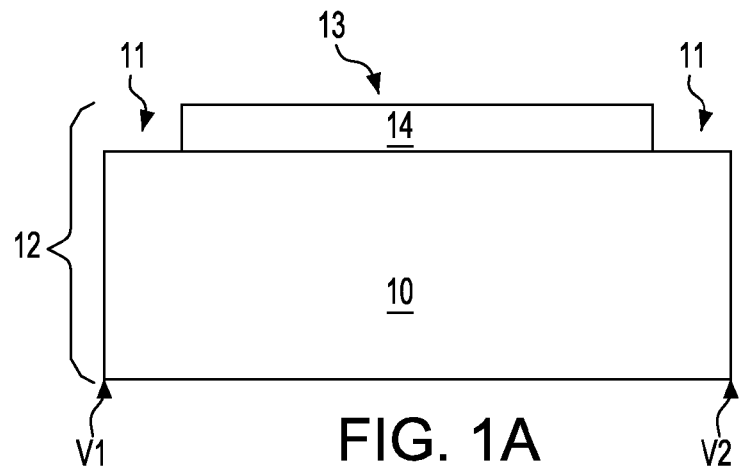
FIG. 1A is a pictorial representation (through a cross sectional view) illustrating a substrate including, from bottom to top, a base portion comprising at least one first material and having a first fracture toughness and a surface portion comprising at least one second material and having a second fracture toughness which differs from the first fracture toughness in accordance with an embodiment of the present disclosure.
Figure 1B:
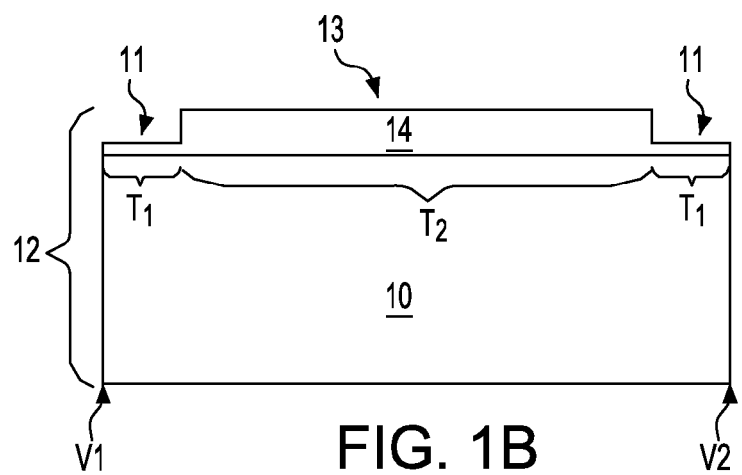
FIG. 1B is a pictorial representation (through a cross sectional view) illustrating another substrate including, from bottom to top, a base portion comprising at least one first material and having a first fracture toughness and a surface portion comprising at least one second material and having a second fracture toughness which differs from the first fracture toughness in accordance with an embodiment of the present disclosure.

Reference is first made to FIGS. 1A-1B which illustrate various substrates 12 that can be employed in the present disclosure and can be subjected to a controlled spalling process. Each substrate 12 includes, from bottom to top, a base portion 10 comprising at least one first material and having a first fracture toughness and a surface portion 14 comprising at least one second material and having a second fracture toughness which differs from the first fracture toughness. The side of the substrate 12 including the surface portion 14 can be referred to herein as a front side 13 of the substrate 12. The side opposite of the substrate 12 opposite the front side can be referred to herein as a backside surface of substrate 12.

In one embodiment of the present disclosure, the first fracture toughness within the base portion 10 of the substrate 12 is greater than the second fracture toughness within the surface portion 14 of the substrate 12. In another embodiment of the present disclosure, the first fracture toughness within the base portion 10 of the substrate 12 is less than the second fracture toughness within the surface portion 14 of the substrate 12.

In accordance with the present disclosure, the substrate 12 has a surface step region 11 on the front side 13 of the substrate 12 and located near each vertical edge V1, V2 of the substrate 12. The term 'surface step region' is used herein to denote a region on the front side 13 of the substrate 12 and near each vertical edge V1, V2 in which the surface portion 14 of the substrate 12 is either completely absent from the base portion 10 (see, for example, FIG. 1A) or the surface portion 14 has a recessed surface relative to an uppermost surface of the surface portion 14 (See, for example, FIG. 1B). Thus, in the case of the substrate 12 shown in FIG. 1A, the surface step region 11 is the region of the substrate 12 in which the surface portion 14 is absent from the base portion 10. In the case of the substrate 12 shown in FIG. 1B, the surface step region 11 is the region including the recessed surface of the surface portion 14.

In the embodiment illustrated in FIG. 1A, the surface step region 11 can be provided by forming a substrate 12 that includes, from bottom to top, a base portion 10 and a non-continuous surface portion 14, wherein the non-continuous surface portion 14 is absent edge regions V1, V2 of the substrate. In another embodiment and as shown in FIG. 1B, the surface step region 11 can be provided by forming a substrate 12 that includes, from bottom to top, a base portion 10 and a continuous surface portion 14, wherein the continuous surface portion 14 comprises a recessed surface and a non-recessed surface. In FIG. 1B, $T_1$ denotes the thickness of recessed regions of the surface portion 14 of substrate 12, and $T_2$ denotes the thickness of adjoining non-recessed region of the surface portion 14 of substrate 12. In accordance with the present disclosure, $T_1$ is less than $T_2$.

The at least one first material of the base portion 10 and the at least one second material of the surface portion 14 which define the substrate 12 may independently of each other comprise a semiconductor material, a glass, a ceramic, or any another material whose fracture toughness is less than that of the stressor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the at least one first material of the base portion 10 and/or the at least one second material of the surface portion 14 comprise(s) a semiconductor material, the semiconductor material may include, but is not limited to, Si, Ge, SiGe, SiGeC, SiC, Ge alloys, GaSb, GaP, GaN, GaAs, InAs, InP, $Al_2O_3$ and/or all other III-V or II-VI compound semiconductors. In some embodiments, the at least one first material of the base portion 10 and/or the at least one second material of the surface portion 14 can comprise(s) multilayered stacks of semiconductor materials. When the at least one first material of the base portion 10 and/or the at least one second material of the surface portion 14 comprise(s) a semiconductor material, the semiconductor material can be doped, undoped or contain doped regions and undoped regions.

In one embodiment, the semiconductor material that can be employed as the at least one first material of the base portion 10 and/or the at least one second material of the surface portion 14 may be single crystalline (i.e., a material in which the crystal lattice of the entire sample is continuous and unbroken to the edges of the sample, with no grain boundaries). In another embodiment, the semiconductor material that can be employed as the at least one first material of the base portion 10 and/or the at least one second material of the surface portion 14 may be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the at least one first material of the base portion 10 and/or the at least one second material of the surface portion 14 may be amorphous (i.e., a non-crystalline material that lacks the long-range order characteristic of a crystal). Typically, the semiconductor material that can be employed as the at least one first material of the base portion 10 and/or the at least one second material of the surface portion 14 is (are) a single crystalline material.

When the at least one first material of the base portion 10 and/or the at least one second material of the surface portion 14 comprise(s) a glass, the glass can be a $SiO_2$-based glass which may be undoped or doped with an appropriate dopant. Examples of $SiO_2$-based glasses that can be employed as the at least one first material of the base portion 10 and/or the at least one second material of the surface portion 14 include undoped silicate glass, borosilicate glass, phosphosilicate glass, fluorosilicate glass, and borophosphosilicate glass.

When the at least one first material of the base portion 10 and/or the at least one second material of the surface portion 14 comprise(s) a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, one or more devices including, but not limited to, transistors (FET or HEMT), capacitors, diodes, BiCMOS, resistors, electro-optical (LED) etc. can be processed on and/or within the surface portion 14 of substrate 12 utilizing techniques well known to those skilled in the art. At least the surface portion 14 of the substrate 12, which may include the one or more devices, can be removed utilizing the method of the present disclosure. In some embodiments, the surface portion 14 of substrate 12 may also include one or more III-V compound semiconductor layers which can be used as an electro-optical device.

In one embodiment, the surface portion 14 of substrate 12 may comprise one of the above mentioned semiconductor materials and the base portion 10 of substrate 12 may include an insulator such as, for example, sapphire. In one embodiment, the surface portion 14 of substrate 12 may comprise GaN and the base portion 10 of substrate 12 may include Si.

The substrates 12 of the present disclosure can be formed utilizing techniques well known to those skilled in the art. For example, the substrate 12 shown in either FIG. 1A or FIG. 1B can be formed by blanket depositing the surface portion 14 of the substrate 12 atop the base portion 10 and then patterning the surface portion 14 utilizing lithography and etching. In one embodiment, the etching comprises a dry etch process such as, for example, reactive ion etching. The etch can completely or partially remove portions of the surface portion 14 near the vertical edges of the base portion 10. In another embodiment and for the substrate 12 shown in FIG. 1A, selective deposition can be used to form the surface portion 14 of the substrate 12 atop a portion of the base portion 10 of the substrate 12. In still another embodiment, laser ablation using, for example, a UV excimer laser, can be used to remove the surface portion 14 from the edges V1, V2 of the substrate. In the case of a UV transparent base portion 10 such as sapphire, the UV ablation can be performed from the backside of the substrate as well as the front side.

In one embodiment of the present disclosure, the surface step region 11 that is formed has a width, w, as measured from a vertical edge V1, V2 of substrate 12 inward from 1 μm to many centimeters, including, for example, 1 cm. In another embodiment of the present disclosure, the surface step region 11 that is formed has a width, w, as measured from a vertical edge V1, V2 of substrate 12 inward from 300 μm to 3 mm. In the embodiment illustrated in FIG. 1A, the width of the surface step region 11 is the distance from vertical edge V1, V2 to a sidewall surface of the surface portion 14. In the embodiment illustrated in FIG. 1B, the width of the surface step region 11 is the distance from vertical edge V1, V2 to a sidewall surface of the non-recessed surface portion 14 having thickness $T_2$.

In some embodiments of the present disclosure, the front side 13 of the substrate 12 can be cleaned prior to further processing to remove surface oxides and/or other contaminants therefrom. In one embodiment of the present disclosure, the front side 13 of the substrate 12 is cleaned by applying to the front side 13 of the substrate 12 a solvent such as, for example, acetone and isopropanol, which is capable of removing contaminates and/or surface oxides from the front side 13 of the substrate 12.

In some embodiments of the present disclosure, the front side 13 of the substrate 12 can have a metallization layer thereon. Such surface metallization layers may serve as Ohmic electrical contacts in the operation of the device. The surface metallization layers can include single or multiple layers of pure metals or alloys that permit the proper functional contact to the front side 13 of surface portion 14. Example surface metallization layers may include Ni, Au, Pd, Al, Ti, Ge, Ag in pure or alloyed form.

In some embodiments of the present disclosure, the front side 13 of the substrate 12 can be made hydrophobic by oxide removal prior to use by dipping the front side 13 of the substrate 12 into hydrofluoric acid. A hydrophobic, or non-oxide, surface provides improved adhesion between said cleaned surface and certain stressor layers to be deposited.

Figure 2:
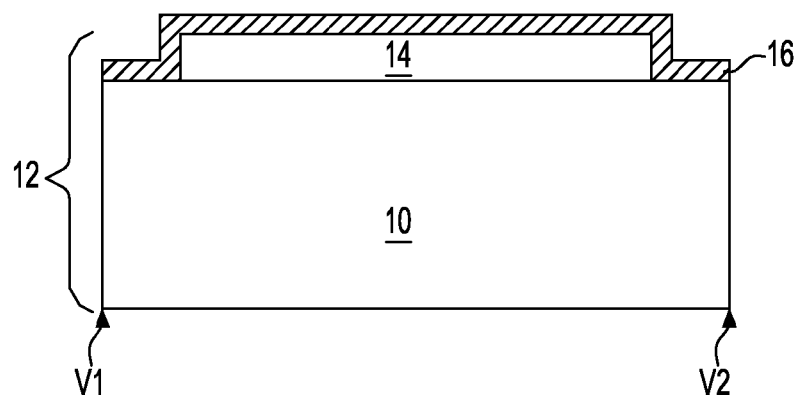
FIG. 2 is a pictorial representation (through a cross sectional view) illustrating the structure of FIG. 1A after forming a metal-containing adhesion layer on the uppermost surface of the surface portion and exposed portions of an uppermost surface of the base portion in accordance with an embodiment of the present disclosure.

Referring now to FIG. 2, there is illustrated the substrate 12 of FIG. 1A after forming an optional metal-containing adhesion layer 16. Although the following description utilizes the substrate 12 shown in FIG. 1A, the same basic processing steps can be applied using the substrate 12 shown in FIG. 1B with similar results. In the embodiment illustrated, a portion of the optional metal-containing adhesion layer 16 located within surface step region 11 is present on an exposed uppermost surface of the base portion 10, and another portion of the optional metal-containing adhesion layer 16 is located on sidewall surfaces and on and uppermost surface of the surface portion 14. In another embodiment (not illustrated), a portion of the optional metal-containing adhesion layer 16 located within surface step region 11 is present on an exposed recessed surface of the surface portion 14 (i.e., the area of the surface portion having thickness $T_1$), and another portion of the optional metal-containing adhesion layer is located on sidewall surfaces and an uppermost surface of the non-recessed surface portion 14 (i.e., the area of the surface portion having thickness $T_2$.

The optional metal-containing adhesion layer 16 is employed in embodiments in which the stressor layer to be subsequently formed has poor adhesion to exposed surfaces of substrate 12 that are located on front side 13. Typically, the metal-containing adhesion layer 16 is employed when a stressor layer comprised of a metal is employed. In some embodiments, an optional plating seed layer (not shown) can be formed directly atop the exposed surfaces on the front side 13 of the substrate 12. The optional plating seed layer can be used together with the metal-containing adhesion layer 16 or in lieu thereof.

The optional metal-containing adhesion layer 16 that can be employed in the present disclosure includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

When present, the optional metal-containing adhesion layer 16 can be formed at a temperature from 15° C. to 40° C., i.e., 288K to 313K, or above. In one embodiment, the optional metal-containing adhesion layer 16 can be formed at a temperature which is from 20° C. (293K) to 180° C. (353K). In another embodiment, the optional metal-containing adhesion layer 16 can be formed at a temperature which is from 20° C. (293K) to 60° C. (333K).

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 16 typically has a thickness from 5 nm to 500 nm, with a thickness from 100 nm to 150 nm being more typical. Other thicknesses for the optional metal-containing adhesion layer 16 that are below and/or above the aforementioned thickness ranges can also be employed in the present disclosure.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Al(bottom)/Ti/Ni(top). The thickness of the optional plating seed layer may vary depending on the material or materials of the optional plating seed layer as well as the technique used in forming the same. Typically, the optional plating seed layer has a thickness from 5 nm to 1 µm. The optional plating seed layer can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present disclosure, the optional metal-containing adhesion layer 16 and/or the optional plating seed layer is (are) formed at a temperature which does not effectuate spontaneous spalling to occur within the substrate 12.

Figure 3:
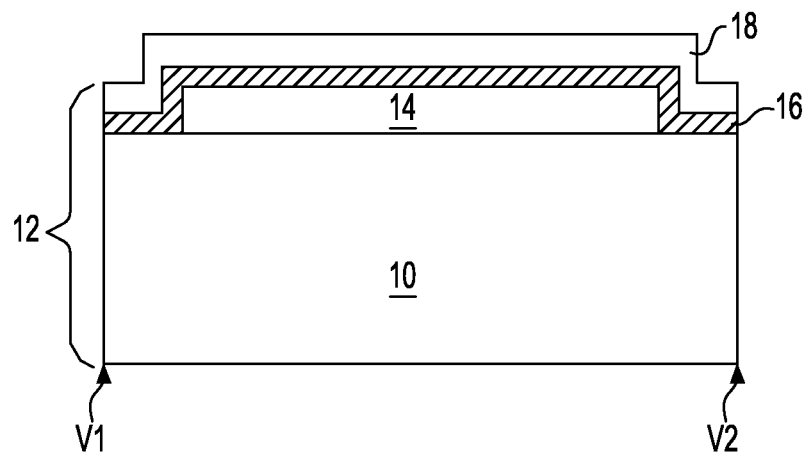
FIG. 3 is a pictorial representation (through a cross sectional view) illustrating the structure of FIG. 2 after forming a stressor layer on a surface of the metal-containing adhesion layer in accordance with an embodiment of the present disclosure.

Referring now to FIG. 3, there is illustrated the structure of FIG. 2 after forming a stressor layer 18 on an uppermost surface of the optional metal-containing adhesion layer 16. In some embodiments in which the optional metal-containing adhesion layer 16 is not present, the stressor layer 18 can be formed directly on exposed surfaces on the front side 13 of substrate 12; this particular embodiment is not shown in the drawings, but can readily be deduced from the drawings illustrated in the present application. In other embodiments in which an optional plating seed layer is employed, the stressor layer 18 can be formed directly on the uppermost surface of the optional plating seed layer; this particular embodiment is also not shown in the drawings, but can readily be deduced from the drawings illustrated in the present application.

The stressor layer 18 employed in the present disclosure includes any material that is under tensile stress on substrate 12 after deposition. The stressor layer 18 can also be referred to a stress inducing layer. In accordance with the present disclosure, the stressor layer 18 has a critical thickness and a stress value that causes spalling mode fracture to occur within the substrate 12. In particular, the stressor layer 18 has a critical thickness in which spalling is initiated below the uppermost surface of substrate 12 and somewhere within the substrate 12. By 'critical', it is meant that for a given stressor material and substrate material combination, a thickness value and a stressor value for the stressor layer is chosen that render spalling mode fracture possible (can produce a $K_I$ value greater than the $K_{IC}$ of the substrate). The stress value can be adjusted by tuning the deposition conditions of the stressor layer 18. For example, in the case of sputter deposition of stressor layer 18, the gas pressure can be used to tune the stress value as described in Thorton and Hoffman, *J. Vac. Sci. Technol.*, 14 (1977) p. 164.

The thickness of the stressor layer 18 is chosen to provide the desired fracture depth somewhere within the substrate 12. For example, if the stressor layer 18 is chosen to be Ni, then fracture will occur at a depth below the stressor layer 18 roughly 2 to 3 times the Ni thickness. The stress value for the stressor layer 18 is then chosen to satisfy the critical condition for spalling mode fracture. This can be estimated by inverting the empirical equation given by $t^* = [(2.5 \times 10^6)(K_{Ic}^{3/2})]/\sigma^2$, where $t^*$ is the critical stressor layer thickness (in microns), $K_{IC}$ is the fracture toughness (in units of $MPa \cdot m^{1/2}$) of the substrate 12 and σ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied to the front side 13 of substrate 12 and thus can be employed as the stressor layer 18 include, but are not limited to, a metal, a polymer, such as a spall inducing tape layer, or any combination thereof. The stressor layer 18 may comprise a single stressor layer, or a multilayered stressor structure including at least two layers of different stressor material can be employed.

In one embodiment, the stressor layer 18 is a metal, and the metal is formed on an uppermost surface of the optional metal-containing adhesion layer 16. In another embodiment, the stressor layer 18 is a spall inducing tape, and the spall inducing tape is applied directly to exposed surfaces on the front side 13 of substrate 12. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Mo, Ti or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, and polyvinyl chloride.

When a spall inducing non-metallic layer (i.e. polymeric materials such as a tape) is employed as the stressor layer 18, the spall inducing layer includes any pressure sensitive tape that is flexible, soft, and stress free at a first temperature used to form the tape, yet strong, ductile and tensile at a second temperature used during removal, i.e., spalling of a material layer from the substrate 12. By "pressure sensitive tape," it is meant an adhesive tape that will stick with application of pressure, without the need for solvent, heat, or water for activation. Tensile stress in the tape at the temperature is primarily due to thermal expansion mismatch between the substrate 12 (with a lower thermal coefficient of expansion) and the tape (with a higher thermal expansion coefficient).

Typically, the pressure sensitive tape that is employed in the present disclosure as stressor layer 18 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 18 employed in the present disclosure is formed at room temperature (15° C.-40° C., i.e., 288K-313K). In another embodiment, when a tape layer is employed, the tape layer can be formed at a temperature from 15° C. (288K) to 60° C. (333K).

When the stressor layer 18 is a metal or polymer, the stressor layer 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 18 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 18 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the atop the substrate 12, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 18 is of a metallic nature, it typically has a thickness of from 3 µm to 50 µm, with a thickness of from 4 µm to 7 µm being more typical. Other thicknesses for the stressor layer 18 that are below and/or above the aforementioned thickness ranges can also be employed in the present disclosure.

If the stressor layer 18 is of a polymeric nature, it typically has a thickness of from 10 µm to 200 µm, with a thickness of from 50 µm to 100 µm being more typical. Other thicknesses for the stressor layer 18 that are below and/or above the aforementioned thickness ranges can also be employed in the present disclosure.

At this point of the method of the present disclosure, the backside of the substrate 12 is secured to a support structure such as, for example, a vacuum chuck or electrostatic chuck.

Figure 4:
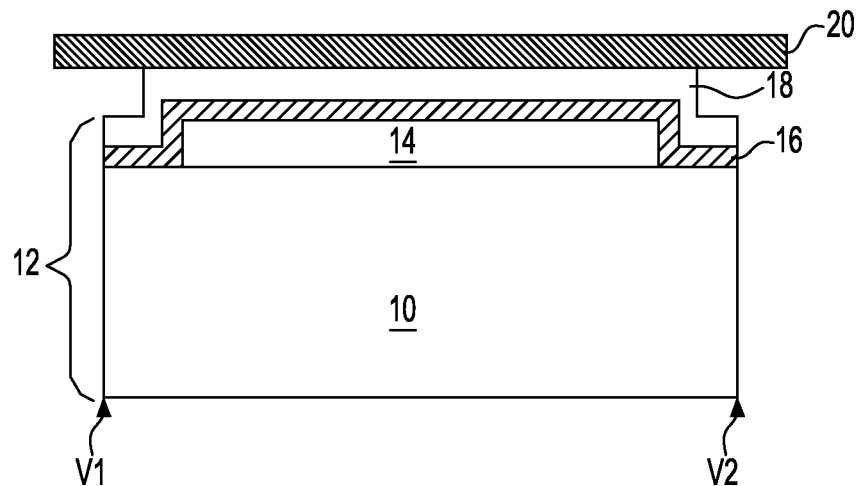
FIG. 4 is a pictorial representation (through a cross sectional view) illustrating the structure of FIG. 3 after forming a handle substrate on a surface of the stressor layer in accordance with an embodiment of the present disclosure.

Referring now to FIG. 4, there is illustrated the structure of FIG. 3 after forming an optional handle substrate 20 atop the stressor layer 18. The optional handle substrate 20 employed in the present disclosure comprises any flexible material which has a minimum radius of curvature of less than 30 cm. Illustrative examples of flexible materials that can be employed as the optional handle substrate 20 include a metal foil or a polyimide foil. In some embodiments, a tape, as described above, can be used as the handle substrate 20.

The optional handle substrate 20 can be used to provide better fracture control and more versatility in handling the spalled portion of the substrate 12. Moreover, the optional handle substrate 20 can be used to guide the crack propagation during the spalling process of the present disclosure. The optional handle substrate 20 of the present disclosure is typically, but not necessarily, formed at a first temperature which is at room temperature (15° C. (288K)-40° C. (313K)).

The optional handle substrate 20 can be formed utilizing deposition techniques that are well known to those skilled in the art including, for example, pressure-sensitive tape application, dip coating, spin-coating, brush coating, sputtering, chemical vapor deposition, plasma enhanced chemical vapor deposition, chemical solution deposition, physical vapor deposition, and plating.

The optional handle substrate 20 typical has a thickness of from 5 µm to 500 µm, with a thickness of from 10 µm to 150 µm being more typical. Other thicknesses for the optional handle substrate 20 that are below and/or above the aforementioned thickness ranges can also be employed in the present disclosure.

Figure 5A:
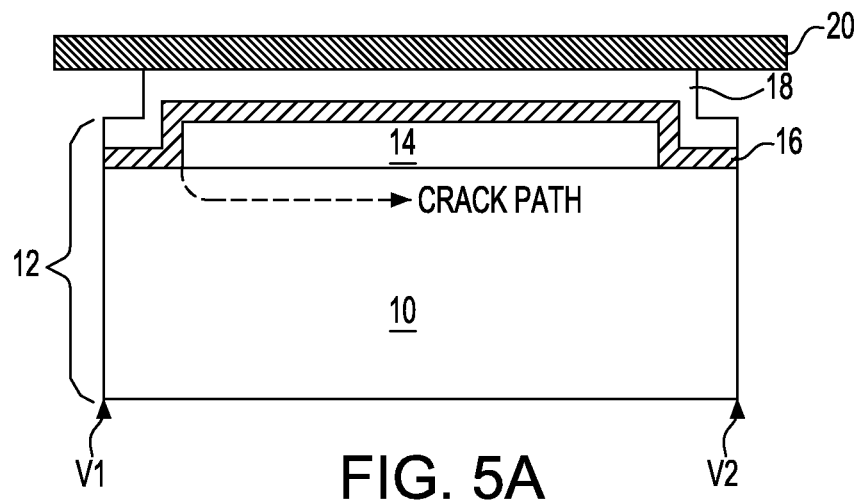
FIG. 5A is a pictorial representation (through a cross sectional view) illustrating a projected crack formation path within the structure of FIG. 4 during a subsequent spalling process in accordance with an embodiment of the present disclosure.

Referring to FIG. 5A, there is illustrated a projected crack path that can be obtained utilizing the surface step region 11 to permit crack initiation and propagation within substrate 12 in accordance with an embodiment of the present disclosure. In such an embodiment, surface portion 14 has a higher $K_{IC}$ than base portion 10. An example of this situation is GaN epitaxially grown on a Si <111> wafer. In this case, the surface step region 11 allows the crack initiation to occur in the weaker Si <111> region (i.e., the base portion 10) thereby reducing the requisite thickness and stress values for stressor layer 18. In this embodiment, the role of the surface step region 11 is to expose base portion 10 to the stressor layer 18 and the optional adhesion layer 16 so the crack never propagates through surface portion 14.

Figure 5B:
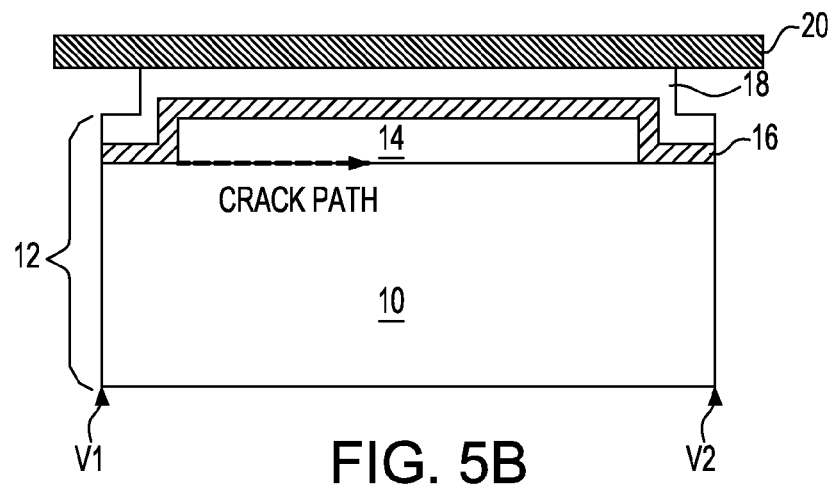
FIG. 5B is a pictorial representation (through a cross sectional view) illustrating a projected crack formation path within the structure of FIG. 4 during a subsequent spalling process in accordance with another embodiment of the present disclosure.

In another embodiment and as shown in FIG. 5B, surface portion 14 has a lower $K_{IC}$ than base portion 10. An example of this situation is GaN epitaxially grown on a sapphire or SiC wafer. In this case, the surface step region 11 provides a stress discontinuity in the corner formed at the junction of $T_1$ and $T_2$ in FIG. 1B (and the equivalent location in FIG. 1A) after the stressor layer 18 is applied. This stress concentration effect reduces the thickness and stress values of stressor layer 18 required to initiate fracture in surface portion 14. Because the depth at which fracture initiates is controlled by the recess depth, fracture can be made to occur within surface portion 14 only, and never in base portion 10. As an extreme example of this, GaN epitaxial layers can be removed from sapphire wafers at the sapphire/GaN interface by first creating a surface step region 11 as illustrated in FIG. 1A. The critical conditions of the stressor layer are then chosen such that fracture in GaN is possible but not in sapphire. Ni stressor layers with approximately 400 MPa tensile stress and a thickness of around 20 to 30 µm can be used to spall GaN layers cleanly off of sapphire substrates using this approach.

Figure 6A:
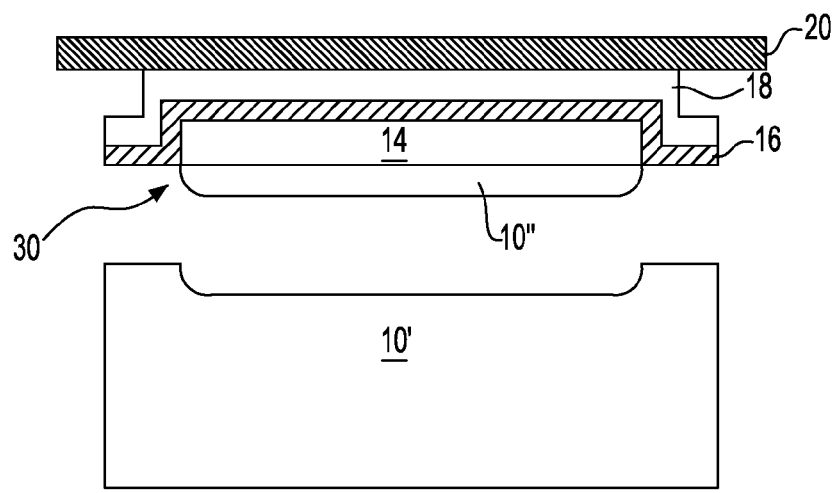
FIG. 6A is a pictorial representation (through a cross sectional view) illustrating the structure of FIG. 4 after performing a spalling process in which the projected crack formation path shown in FIG. 5A is followed in accordance with one embodiment of the present disclosure.

Referring to FIG. 6A, there is illustrated the structure of FIG. 4 after removing a material layer 30 of the substrate 12 by spalling. In one embodiment of the present disclosure, the spalling process includes pulling or peeling the handle substrate 20 to remove a spalled structure that includes at least the stressor layer 18 and material layer 30. The material layer 30 that is spalled from the substrate in this embodiment comprises surface portion 14 (i.e., the second material) as well as a base layer portion 10" (i.e., first material). Base layer portion 10" includes part of the original base portion 10. In FIG. 6A, reference numeral 10' denotes another base layer portion which includes another part of the original base portion 10.

Figure 6B:
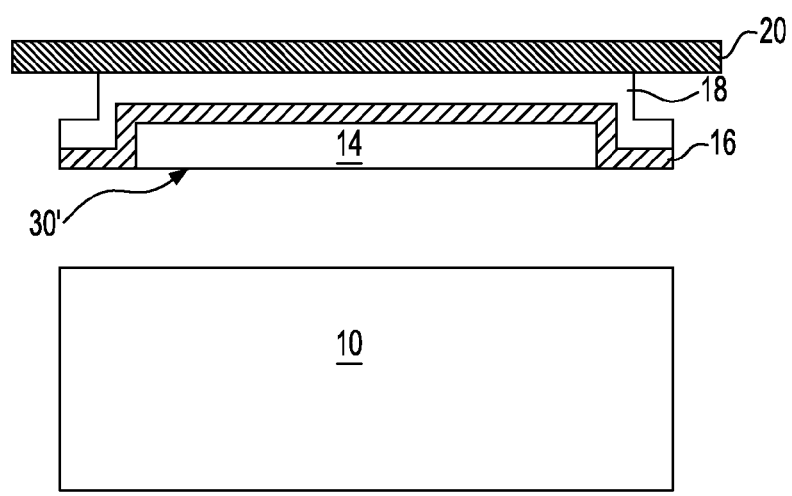
FIG. 6B is a pictorial representation (through a cross sectional view) illustrating the structure of FIG. 4 after performing a spalling process in which the projected crack formation path shown in FIG. 5B is followed in accordance with another embodiment of the present disclosure.

Referring to FIG. 6B, there is illustrated the structure of FIG. 4 after removing material layer 30' from the substrate 12 by spalling. In this embodiment, the material layer 30' that is spalled from substrate 12 includes only the first material of the surface portion 14.

In either embodiment, the spalling process includes crack formation and propagation within the substrate 12. The spalling process is initiated at substantially room temperature (i.e., 15° C. to 40° C.). In other embodiments, spalling can be performed at a temperature from 100° C. and below. In some embodiments of the present disclosure, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, the optional handle substrate 20, stressor layer 18, and, if present the optional plating seed layer and the optional metal-containing adhesion layer 16 can be removed from the material layer 30 or material layer 30'. The optional handle substrate 20, the stressor layer 18, the optional plating seed layer and the optional metal-containing adhesion layer portion 16 can be removed from the material layer 30 or material layer 30' that was removed from substrate 12 utilizing conventional techniques well known to those skilled in the art. For example, and in one embodiment, aqua regia ($HNO_3$/HCl) can be used for removing the optional handle substrate 20, the stressor layer 18, the optional plating seed layer, and the optional metal-containing adhesion layer 16. In another example, UV or heat treatment is used to remove the optional handle substrate 20 followed by a chemical etch to remove the stressor layer 18, followed by a different chemical etch to remove the optional plating seed layer, and optional metal-containing adhesion layer 16. In some embodiments, the base layer portion 10" may be selectively removed by wet or dry chemical etching.

The thickness of the material layer 30 or material layer 30' that is removed from the substrate 12 varies depending on the material of the stressor layer 18 and the materials of the substrate 12 itself. In one embodiment, the material layer 30 or material layer 30' that is removed from the substrate 12 has a thickness of less than 100 microns. In another embodiment, the material layer 30 or material layer 30' that is removed from the substrate 12 has a thickness of less than 50 microns.

The present disclosure can be used in fabricating various types of thin-film devices including, but not limited to, semiconductor devices, photovoltaic devices, and electronic and optoelectronic devices that are flexible.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A method for removing a material layer from a substrate, said method comprising:
    providing a substrate comprising, from bottom to top, a base portion comprising at least one first material having a first fracture toughness and having an entirely planar topmost surface and a surface portion comprising at least one second material having a second fracture toughness and having a bottommost surface forming an interface with said topmost surface of said base portion, wherein the second fracture toughness differs from the first fracture toughness and wherein a surface step region is located at each vertical edge and on a front side of the substrate, wherein said surface step region comprises a recessed portion of said first material or a region void of said first material;
    forming a stressor layer atop the front side of the substrate; and
    removing a material layer from the substrate by spalling, wherein crack propagation occurs only in one of the first material or the second material.

2. The method of claim 1, wherein said providing the substrate comprises blanket depositing said surface portion on said base portion, and patterning said surface portion to include said surface step region therein.

3. The method of claim 2, wherein said patterning comprising lithography and etching.

4. The method of claim 3, wherein said etching completely removes exposed regions of the surface portion.

5. The method of claim 3, wherein said etching partially removes exposed regions of the surface portion.

6. The method of claim 5, wherein said partially removed exposed regions of the surface portion have a first thickness than is less than a second thickness of an adjoining region of the surface portion.

7. The method of claim 2, wherein said patterning comprises laser ablation.

8. The method of claim 2, wherein said patterning comprises reactive ion etching.

9. The method of claim 1, wherein said providing the substrate comprises a selective deposition process in which the surface portion is formed on a predetermined region of the base portion.

10. The method of claim 1, wherein said first fracture toughness is greater than the second fracture toughness.

11. The method of claim 1, wherein said first fracture toughness is less than the second fracture toughness.

12. The method of claim 1, further comprising forming a metal-containing adhesion layer between the stressor layer and the substrate.

13. The method of claim 1, wherein the stressor layer comprises a metal, a polymer, a spalling inducing tape or any combination thereof.

14. The method of claim 1, wherein said stressor layer is Ni.

15. The method of claim 14, wherein said handle layer is a tape formed directly on the stressor layer wherein said spalling comprises peeling or pulling said tape.

16. The method of claim 1, further comprises forming a handle substrate on an exposed surface of the stressor layer.

17. The method of claim 1, wherein said spalling is performed at room temperature.

18. The method of claim 1, further comprising removing at least said stressor layer from said material layer.

19. The method of claim 1, wherein surface step region has a width which extends inwards from one of said vertical edges from 1 µm to 1 cm.

20. The method of claim 1, wherein said stressor layer directly contacts said front side of the substrate including said surface step region.

21. The method of claim 1, wherein said first material comprises sapphire or SiC and said second material comprises a semiconductor material.

22. The method of claim 1, wherein said first material comprises Si or Ge and said second material comprises a semiconductor material.

23. The method of claim 1, wherein said second material comprises one or more III-V compound semiconductors.

24. The method of claim 1, wherein said surface portion comprises one or more semiconductor devices built thereon.

\* \* \* \* \*